(12) United States Patent
Yi et al.

(10) Patent No.: US 6,387,779 B1
(45) Date of Patent: May 14, 2002

(54) METHOD OF CRYSTALLIZING A SILICON FILM AND THIN FILM TRANSISTOR AND FABRICATING METHOD THEREOF USING THE SAME

(75) Inventors: Jonghoon Yi; Sanggul Lee, both of Seoul (KR)

(73) Assignee: LG. Philips LCD Co., LTD, Seoul (KR)

( * ) Notice: Subject to any disclaimer, the term of this patent is extended or adjusted under 35 U.S.C. 154(b) by 0 days.

(21) Appl. No.: 09/549,521

(22) Filed: Apr. 14, 2000

(30) Foreign Application Priority Data

Apr. 16, 1999 (KR) .............................................. 99-13471

(51) Int. Cl.[7] .............................................. H01L 21/20
(52) U.S. Cl. ........................ 438/486; 438/149; 438/164; 438/166; 438/487; 438/488; 438/489; 438/495; 438/506; 438/508; 438/151; 438/795; 257/52; 257/75
(58) Field of Search ................................ 438/486, 487, 438/488, 489, 495, 506, 508, 149, 164, 166, 151, 795; 257/52, 75

(56) References Cited

U.S. PATENT DOCUMENTS

| | | | |
|---|---|---|---|
| 4,309,225 A | * 1/1982 | Fan et al. ...................... | 148/1.5 |
| 5,970,368 A | * 10/1999 | Sasaki et al. ................. | 438/487 |
| 6,017,781 A | * 1/2000 | Shimizu et al. .............. | 438/158 |
| 6,165,875 A | * 12/2000 | Fonash et al. ............... | 438/486 |
| 6,190,949 B1 | * 2/2001 | Noguchi et al. ............. | 438/149 |
| 6,274,414 B1 | * 8/2001 | Ogata et al. ................. | 438/166 |

OTHER PUBLICATIONS

Aya et al., Pub. No.: US 2001/0003659 A1 Pub. Date: Jun. 14, 2001.*
Kim, Pub. No.: US 2001/0012702 A1, Pub. Date: Aug. 9, 2001.*

* cited by examiner

*Primary Examiner*—Matthew Smith
*Assistant Examiner*—Belur V Keshavan
(74) *Attorney, Agent, or Firm*—Birch, Stewart, Kolasch & Birch, LLP

(57) ABSTRACT

The present invention relates to a method of crystallizing a silicon film, a thin film transistor, and a fabricating method thereof using the same. More particularly, the present invention relates forming a crystalline silicon film by crystallizing a silicon film using laser energy, and a thin film transistor and a fabricating method thereof using the same. The present invention includes forming a buffer layer on a substrate and forming an amorphous silicon film on the buffer layer wherein the amorphous silicon film includes a first region and second regions connected to both ends of the first region. The buffer layer is etched to a degree by using the amorphous silicon as a mask, wherein a space is formed under the first region and a central part of the second region contacts a remaining portion of the buffer layer. The amorphous silicon film is then crystallized. In another aspect, the present invention includes a method of fabricating a thin film transistor using this method of crystallizing an amorphous silicon film.

22 Claims, 17 Drawing Sheets

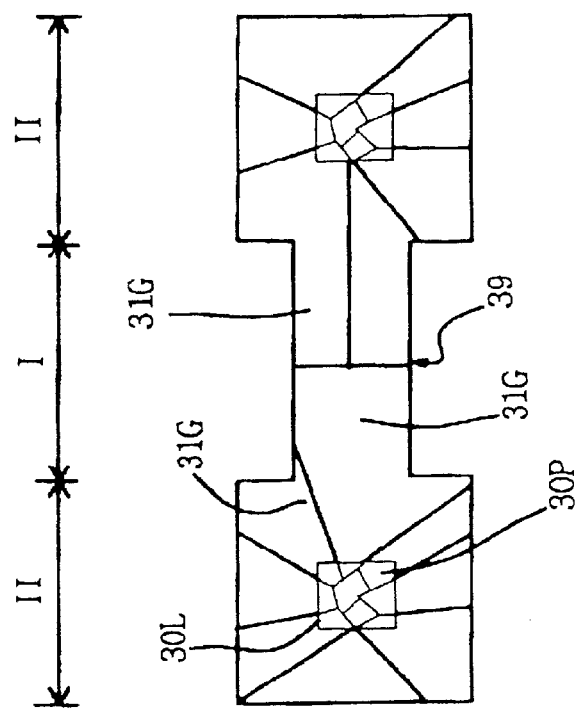
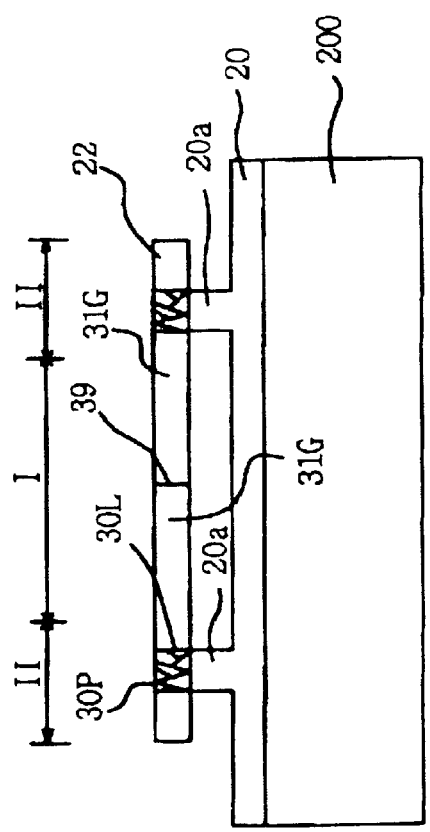

METHOD OF CRYSTALLIZING A SILICON FILM AND THIN FILM TRANSISTOR AND FABRICATING METHOD THEREOF USING THE SAME

BACKGROUND OF THE INVENTION

1. Field of Invention

The present invention relates to a method of crystallizing a silicon film, a thin film transistor, and a fabricating method for a thin film transistor. More particularly, the present invention relates to a method for crystallizing a silicon film using laser energy, a thin film transistor, and a fabricating method for a thin film transistor using laser energy.

2. Discussion of Related Art

Silicon can be crystallized by using laser energy to melt amorphous silicon and extracting silicon crystals by cooling down or solidifying the fused silicon. In this case, monocrystalline silicon is formed if the growing direction of silicon is uniform relative to the growth of grains. Otherwise, polycrystalline silicon is formed when a plurality of crystals grow randomly and simultaneously.

When an active layer of a thin film transistor (hereinafter abbreviated TFT) is formed by crystallizing an amorphous silicon layer, TFT characteristics are improved by reducing the number of grain boundaries (which hinders the transportation of carriers) by increasing the size of the respective silicon grains.

Moreover, a reduced number of grain boundaries improves the interfacial characteristics between the silicon and the gate insulating layers since the grain boundaries cause deterioration in the interface between the silicon and the gate insulating layers.

FIG. 1A to FIG. 1D are cross-sectional views illustrating crystallization of an amorphous silicon film according to a related art.

Referring to FIG. 1A, a buffer oxide layer 10 and an amorphous silicon film 11 are successively deposited on an insulating substrate 100.

Referring to FIG. 1B, the substrate 100 is supplied with laser energy by irradiating with a laser beam. In this case, the laser beam has sufficient energy to melt down the entire amorphous silicon film 11 except predetermined solid silicon regions 12 of the amorphous silicon film. The reference numeral '13' denotes a liquid silicon region which is fused by being exposed to the laser beam.

Referring to FIG. 1C, the liquid silicon region 13 is cooled down to encourage the growth of silicon grains when the supply of the laser energy is stopped.

First, the silicon regions 12 remaining in the liquid silicon 13 become seeds of silicon grains for silicon crystallization.

Then, silicon grains 14-1, 14-2, and 14-3 which grow from the silicon regions 12 stop when they collide with one another. In accordance with the location of each seed, silicon crystallization occurs simultaneously in various spots of the silicon film, thereby forming a polycrystalline silicon film 14.

Referring to FIG. 1D, a gate insulating layer 16 and a gate electrode 17 are formed on an active layer 15 by patterning the crystallized silicon film by photolithography.

A TFT is fabricated by forming a source region 15S and a drain region 15D by doping the exposed parts of the active layer 15 by a known method.

Unfortunately, protruding silicon regions (caused by the collision of silicon grains grown during crystallization) are generated on the surface of the active layer 15.

The grain boundaries protruding out of the surface of the active layer 15 deteriorates step coverage of the gate insulating layer as well as the interfacial contact characteristics between the active layer and gate insulating layer, thereby negatively affecting the TFT characteristics.

Moreover, the plurality of grain boundaries existing inside the active layer lowers the transporting speed of carriers, thereby reducing current mobility in the TFT.

SUMMARY OF THE INVENTION

Accordingly, the present invention is directed to a method of crystallizing a silicon film, a thin film transistor, and a fabricating method for thin film transistor that substantially obviate one or more of the problems due to limitations and disadvantages of the related art.

The present invention therefore improves the characteristics of a silicon film by means of lengthening the time that the silicon is in a liquid state during the crystallization of liquid silicon in order to increase the silicon grain size.

Additional features and advantages of the invention are set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes forming a buffer layer on a substrate and forming an amorphous silicon film on the buffer layer. The amorphous silicon film includes a first region having a first dimension and second regions connected to respective ends of the first region and having respective second dimensions larger than the first width. The buffer layer under the amorphous silicon film is partially etched using the amorphous silicon as a reference mask. The buffer layer under the first region is removed to form a space, and a central part of the second regions contact the remaining buffer layer at respective locations. The amorphous silicon film is then crystallized.

Another embodiment of the present invention comprises forming a buffer layer on a substrate and forming an amorphous silicon film on the buffer layer. The amorphous silicon film includes a first region having a first dimension and second regions connected to respective ends of the first region and having a second dimension greater than the first dimension. The buffer layer is partially etched by an amount between the first and second dimensions by using the amorphous silicon as a reference mask. Therefore, the buffer layer under the first region is removed to form a space and a central part of each second region contacts the remaining buffer layer. The amorphous silicon film is then crystallized. An active layer supported by the remaining buffer layer is formed by patterning the crystallized silicon film by . A gate insulating layer is formed covering the substrate including the active layer. A gate electrode is formed on the gate insulting layer over the active layer. A source region and a drain region is formed in the active layer by carrying out impurity doping using the gate electrode as a mask.

In a further embodiment of the present invention, a thin film transistor includes a substrate, a buffer layer having a protruding part and formed on the substrate, and an active layer supported by the protruding part and including a channel region, a source region, and a drain region. The channel region is defined in a portion which is not supported by the protruding part of the buffer layer and the source and drain regions are defined at both ends of the channel region. A gate insulating layer is formed on the active layer, and a gate electrode is formed on the gate insulating layer over the active layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIG. 2A to FIG. 2E are cross-sectional views illustrating crystallization of a silicon film according to a first embodiment of the present invention;

FIG. 3A to FIG. 3E are plan views of the silicon film patterns shown in FIG. 2A to FIG. 2E, respectively;

DETAILED DESCRIPTION OF PREFERRED EMBODIMENTS

Reference will now be made in detail to the preferred embodiments of the present invention, examples of which are illustrated in the accompanying drawings.

FIG. 2A to FIG. 2E are cross-sectional views illustrating crystallization of a silicon film according to a first embodiment of the present invention, and FIG. 3A to FIG. 3E are corresponding plan views of the silicon film patterns shown in FIG. 2A to FIG. 2E.

Figure 1A:
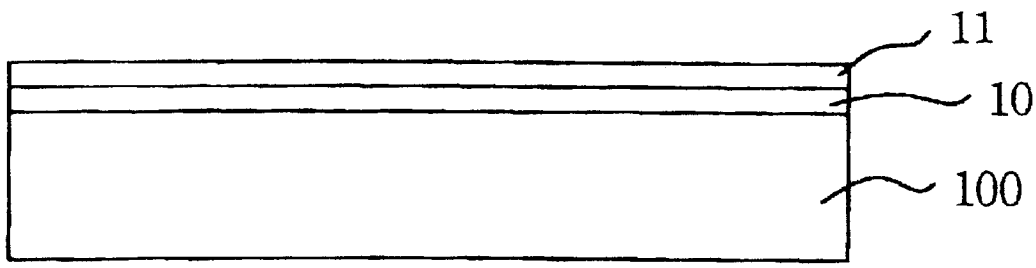
FIG. 1A to FIG. 1D are cross-sectional views illustrating crystallization of an amorphous silicon film according to a related art.
Figure 1B:
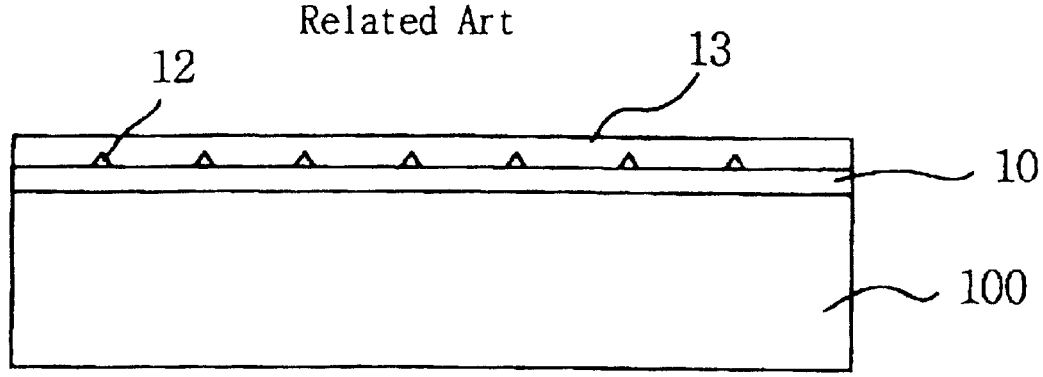
Figure 1C:
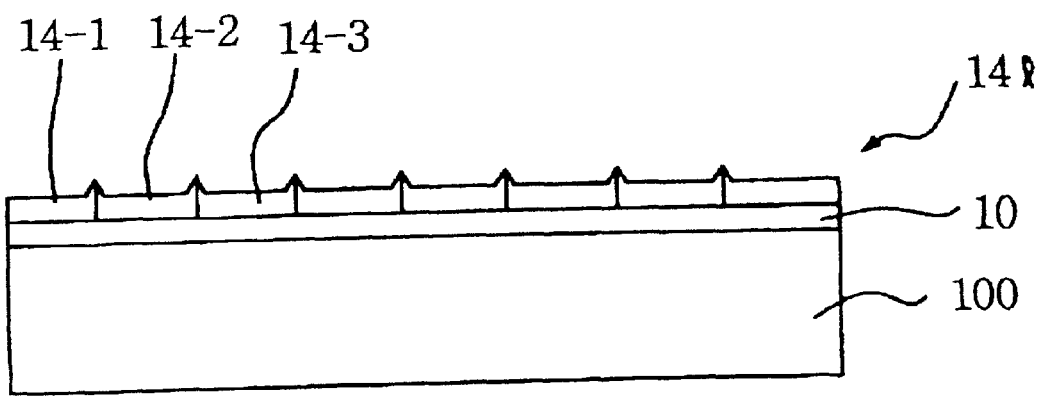
Figure 1D:
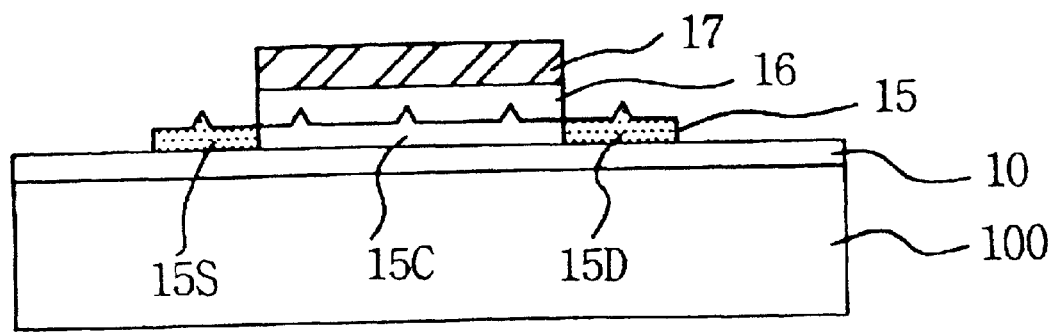
Figure 3A:
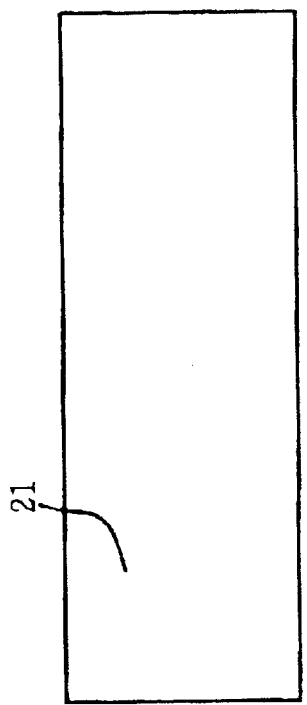
Figure 2A:
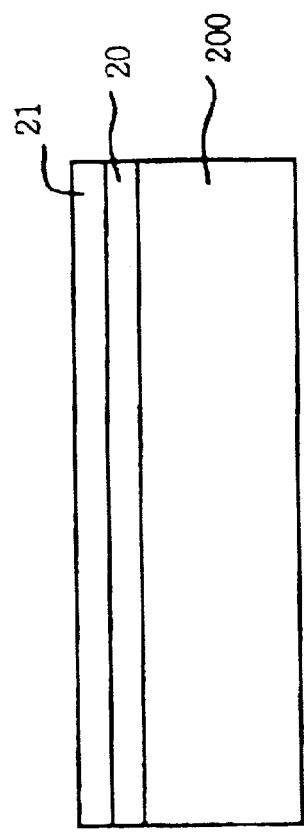

Referring to FIG. 2A and FIG. 3A, after a buffer layer 20 has been formed on an insulating layer 200, an amorphous silicon film 21 is deposited on the buffer layer 20.

The buffer layer 20 is formed of a substance having a thermal conductivity higher than that of air, such as an oxide layer.

Figure 3B:
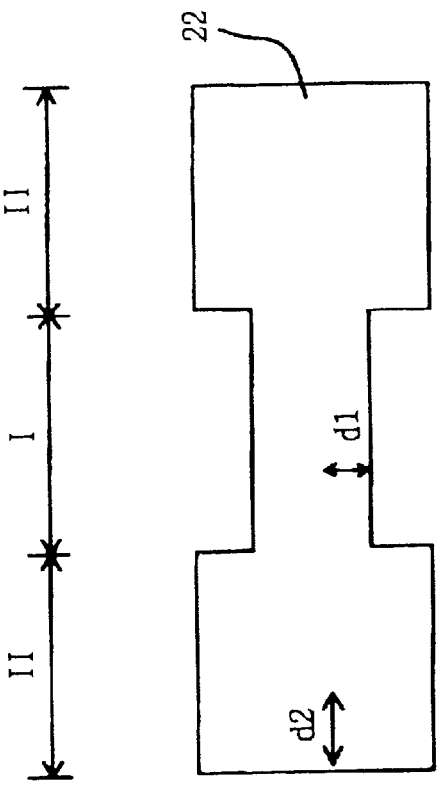
Figure 2B:
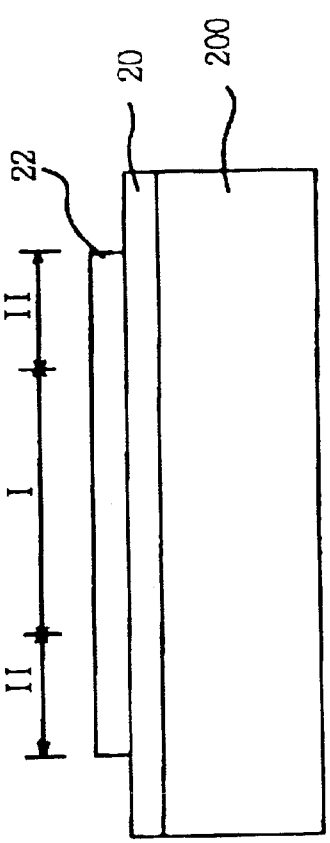

Referring to FIG. 2B and FIG. 3B, an amorphous silicon film pattern 22 having a predetermined shape is formed by patterning the amorphous silicon film 21 by, for example, photolithography.

The predetermined shape includes a first region I of a first size and second regions 11, as seen in FIG. 3B.

As shown in the drawings, the first region I lies at the center of the silicon film pattern 22 and has a first dimension 'd1', and the rectangular second regions 11 each have a second dimension 'd2' larger than 'd1' and are connected to respective ends of the first region I. The dimensions 'd1' and 'd2' are the distances from an edge of the first and second regions I and II, respectively, to an imaginery axis cutting each region in half.

Figure 3C:
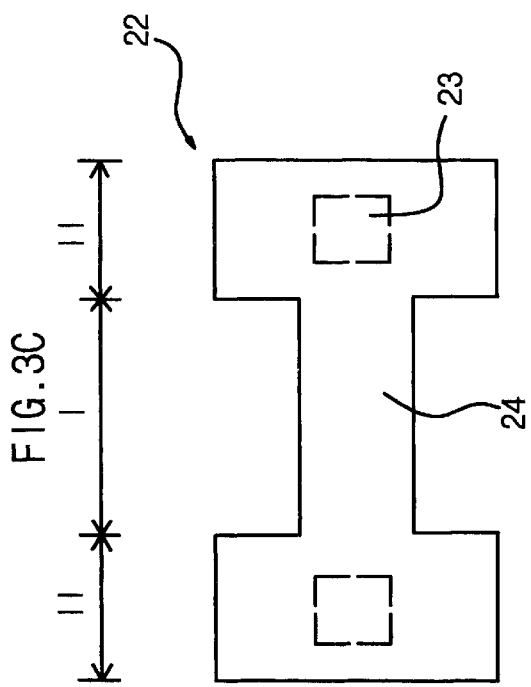
Figure 2C:
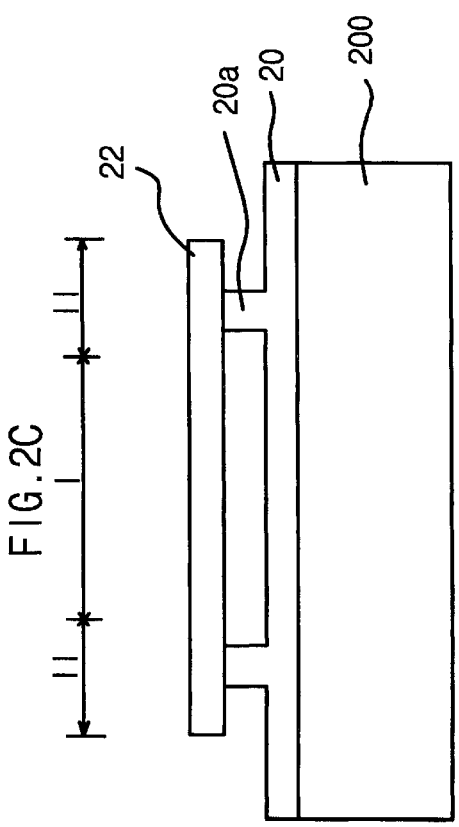

Referring to FIG. 2C and FIG. 3C, the buffer layer 20 is etched using the amorphous silicon film pattern 22 as a mask, whereby an under-part of the first region I of the amorphous silicon film has a space formed and partial under-parts of the second regions 11 are contacted with the a remaining buffer layer(hereinafter abbreviated a buffer bridge) 20a.

The buffer bridge 20a supporting the silicon film 22 is a portion of the buffer layer 20 remaining beneath a central part of the second regions 11 of the amorphous silicon film pattern 22. The buffer bridge 20a is formed by partially etching the buffer layer 20 using the amorphous silicon film pattern 22 as a mask to the degree larger than 'd1' and smaller than 'd2'.

In the following description of the first embodiment of the present invention, a silicon region 23 contacting the buffer bridge 20a is called a buffer contact region, while a region 24 having free space thereunder is called a space contact region.

An etchant used for etching the buffer layer 20 is selected in accordance with the species of the buffer layer material. BOE (buffer oxide etchant) may be used if the buffer layer 20 is formed of an oxide layer in the embodiment of the present invention.

Figure 3D:
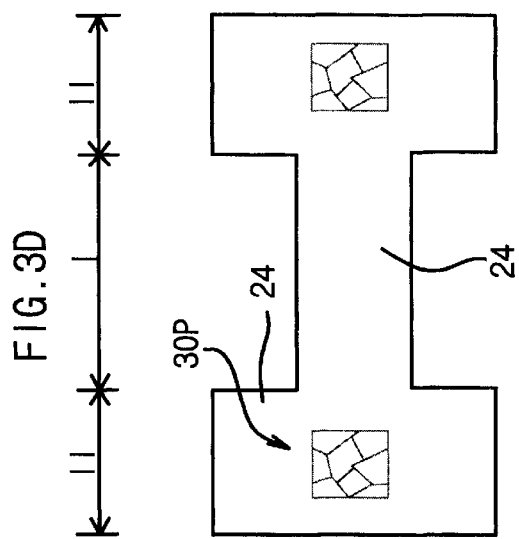
Figure 2D:
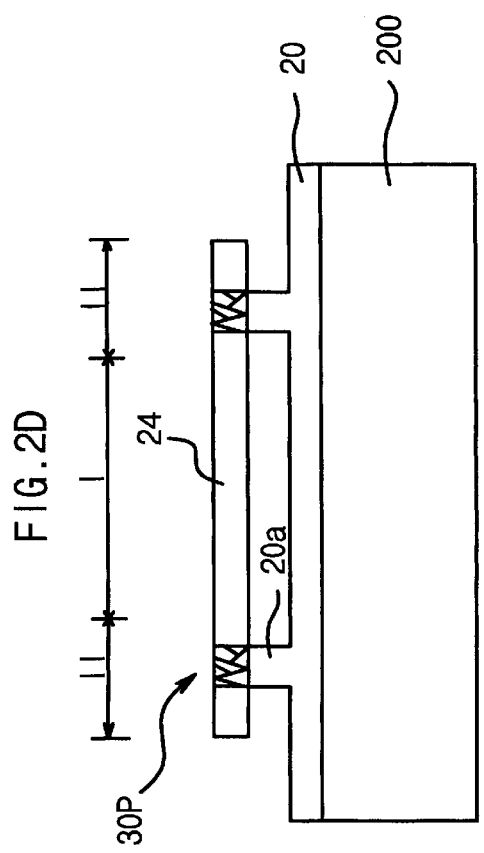

Referring to FIGS. 2D and 3D, the amorphous silicon film pattern 22 is supplied with laser energy by a single shot to carry out crystallization. In this case, the laser energy is capable of melting down the entire amorphous silicon film pattern 22.

The amorphous silicon film pattern 22 supplied with laser energy turns into liquid silicon.

Solidification proceeds as soon as the supply of laser energy stops since the liquid silicon rapidly cools down. During this cooling, crystallization occurs first in regions cooled down to a predetermined degree. In this case, silicon nuclei (which become seeds for silicon grains) are generated. Silicon grains then grow from the nuclei.

Heat is dissipated from the buffer contact region 23 more rapidly than from the space contact region 24. This is because heat conductivity of the free space is smaller than at the buffer contact region 23. Thus, a polycrystalline silicon region 30P is formed because silicon nuclei are generated and grow first in the buffer contact region 23 no later than in the space contact region 24.

In this case, the liquid state of the silicon is maintained since heat dissipation from the space contact region 24 occurs relatively slowly. As the speed at which the laser energy in the space contact region 24 dissipates is much slower than that in the buffer contact region 23, the buffer contact region 23 cools first so as to generate and grow silicon grains, while the silicon in the space contact region 24 is kept liquid phase longer.

Therefore, the provision of free space under the space contact region 24 extends the liquid phase of the silicon in the space contact region 24.

Referring to FIG. 2E and FIG. 3E, a side 30L of the polycrystalline silicon region 30P, which is located at an interface between the polycrystalline silicon region 30P and the liquid silicon of the space contact region 24, acts as seeds for silicon grains, from which grain growth continues.

In addition, silicon grains 31G at the interface 30L between the polycrystalline silicon region 30P of solid state and the liquid silicon grow in a direction perpendicular to the interface 30L.

The growth length of the silicon grains 31G depends on the length of time that the liquid state of silicon is maintained. Thus, in the present invention, the liquid silicon contacts the free space, where heat dissipates much more slowly than in other substances, thereby greatly extending the time maintained in the liquid phase to carry out silicon crystallization. Therefore, the length of each silicon grain is desirably elongated.

As a result of the crystallization, at least one grain boundary 39 formed by the collision of laterally growing silicon grains 31G from respective sides of the polycrystalline silicon regions 30P of the second regions 11 exists in the first region I of the amorphous silicon film. Device characteristics similar to those of a monocrystalline silicon TFT are achieved provided that the grain boundary 39 is used as a channel region of aTFT.

Figure 4A:
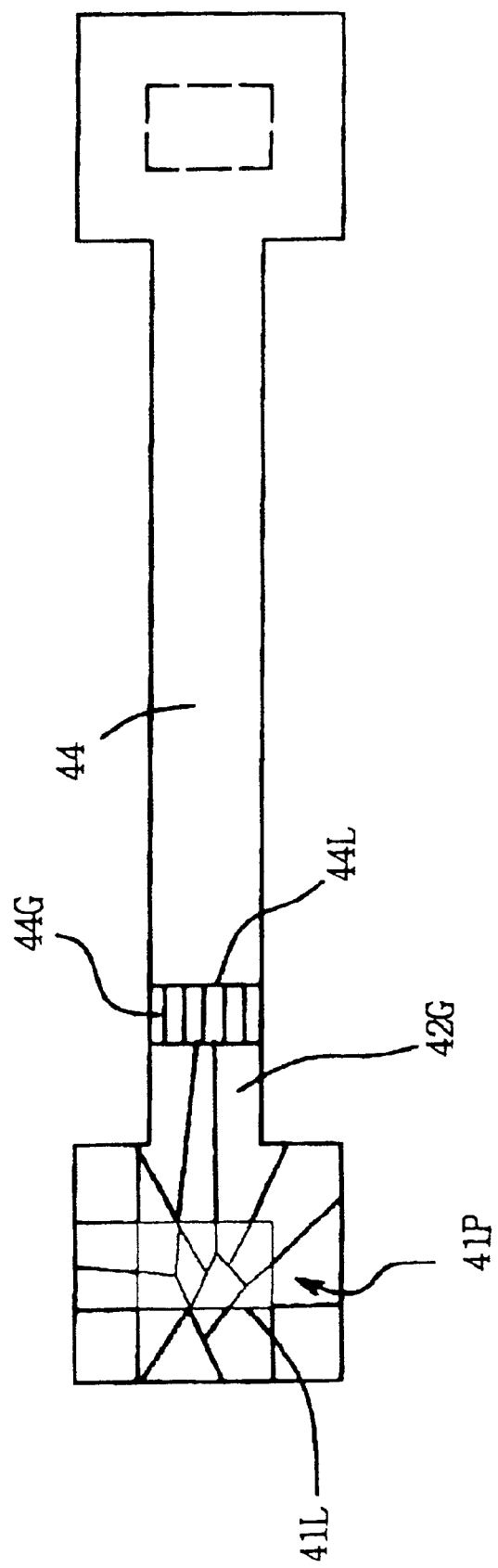
FIG. 4A to FIG. 4C are plan views illustrating crystallization of a silicon film according to a second embodiment of the present invention.
Figure 4B:
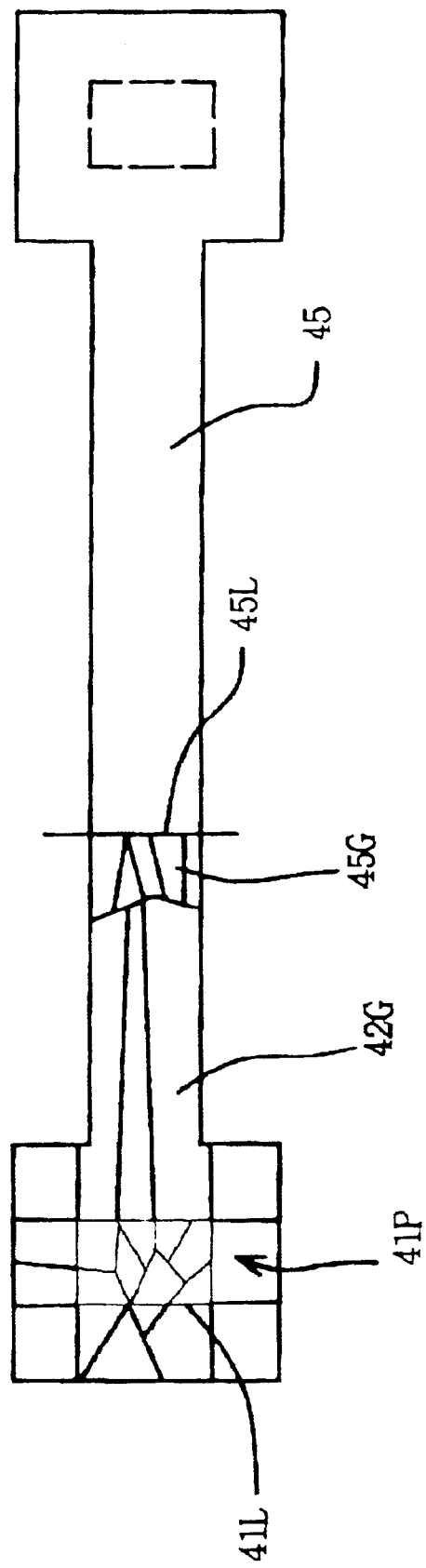
Figure 4C:
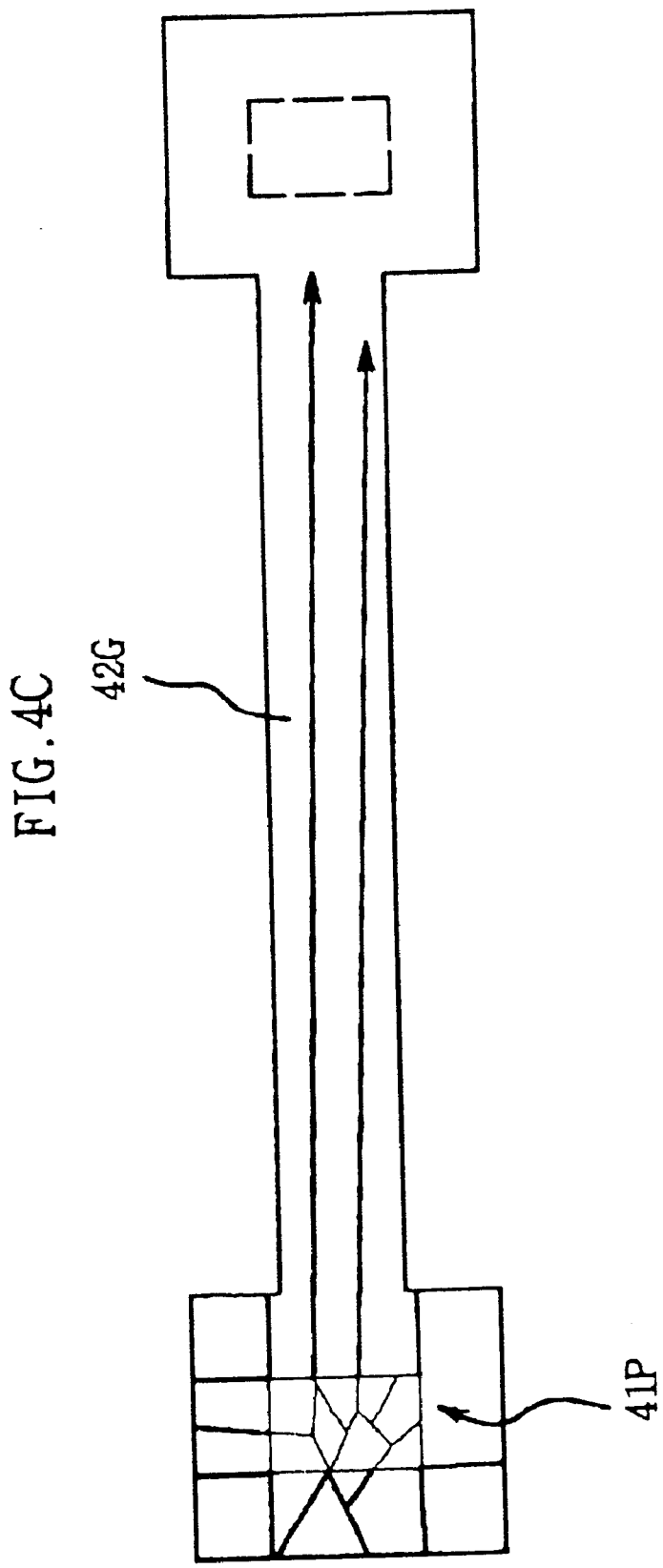

FIG. 4A to FIG. 4C show cross-sectional views of crystallizing a silicon film according to a second embodiment of the present invention.

The second embodiment of the present invention is carried out under the same condition of the first embodiment (especially using a buffer bridge) but laser crystallization is achieved by another supplying method of laser beam.

The second embodiment of the present invention relies on sequential lateral crystallization using multiple applications of laser energy irradiated with a predetermined overlapping ratio, while the first embodiment uses a single application of laser energy.

Sequential lateral crystallization, which takes advantage of the fact that silicon grains grow perpendicularly to an interface between the liquid silicon and the solid silicon regions, has grains grow laterally to predetermined lengths by suitably manipulating the magnitude of laser energy used and the irradiation displacement of a laser beam properly (Robert S. Sposilli, M. A. Crowder, and James S. Im, Mat. Res. Soc. Symp. Proc. Vol. 452, 956–957, 1997).

The following drawings show only a silicon film pattern for the convenience of description.

Referring to FIG. 4A, as explained in the first embodiment of the present invention, a first laser beam irradiation is carried out on a patterned amorphous silicon film pattern but the laser beam pattern has a width smaller than a pattern of the amorphous silicon film.

A portion of the silicon irradiated by the laser beam is liquified, so crystallization occurs immediately.

In a buffer contact region where heat dissipation occurs relatively rapidly, a polycrystalline silicon region 41P is formed as silicon generation and nuclei growth take place. Silicon grains 42G grow laterally in a first direction from an interface 41L of the polycrystalline silicon region 41P, as explained in the first embodiment of the present invention.

Simultaneously, a portion of the silicon, at an interface 44L between amorphous silicon region 44 which is not liquified and the liquid silicon operates as seeds to grow other silicon grains 44G laterally in a second direction towards the liquified silicon.

The grain growth stops where the silicon grains 42G and 44G (having grown from opposite directions) collide each other.

Referring to FIG. 4B, after the amorphous silicon film pattern is displaced by a distance shorter than the length of the silicon grain growth occurring as a result of the first laser beam irradiation, a second laser beam irradiation is carried out.

A portion of the silicon irradiated by the laser beam is liquified, and crystallization occurs immediately.

Silicon grains 42G growing from the polycrystalline silicon region 41P grow continuously in the direction of the liquified silicon.

Simultaneously, a portion of the silicon, which is at an interface 45L between an amorphous silicon region 45 which is not liquified and the liquid silicon acts as seeds to laterally grow other silicon grains 45G in a second direction opposite to silicon grains 42G.

The growth stops at the place where the silicon grains 42G and 45G (having grown from opposite directions) collide each other.

Referring to FIG. 4C, as mentioned in the above explanation, sequential lateral crystallization includes relatively displacing the amorphous silicon film, fusing the amorphous silicon film using laser beam irradiation, and crystallizing the silicon. Sequential lateral crystallization is carried out repeatedly to grow the silicon grains 42G from the polycrystalline region 41P having required sizes.

As a result of the above crystallization, a monocrystalline silicon region consisting of a single silicon grain 42G is formed in the first region 1. Therefore, a monocrystalline silicon TFT can be fabricated on an insulating substrate if the monocrystalline silicon region is used as a channel region of a TFT.

In the following descriptions of the third to sixth embodiments of the present invention, silicon crystallization of the first or second embodiment of the present invention is introduced with the same condition (especially using a buffer bridge). But, an amorphous silicon film is patterned selectively to control the growing direction of silicon grains.

The drawings for the third to sixth embodiments of the present invention only show a silicon film pattern for the convenience of explanation.

Figure 5A:
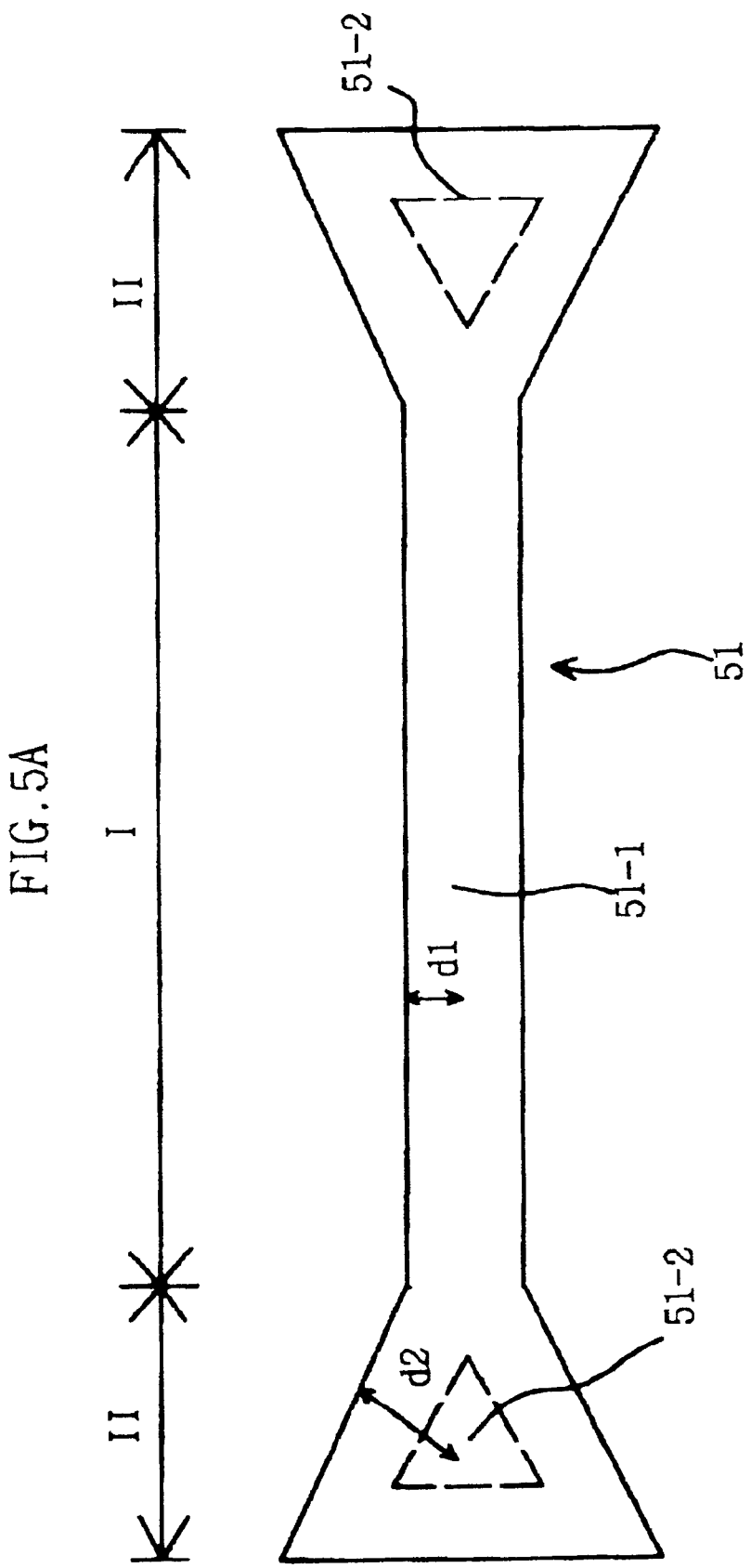
FIG. 5A and FIG. 5B are plan views illustrating crystallization of a silicon film according to a third embodiment of the present invention.
Figure 5B:
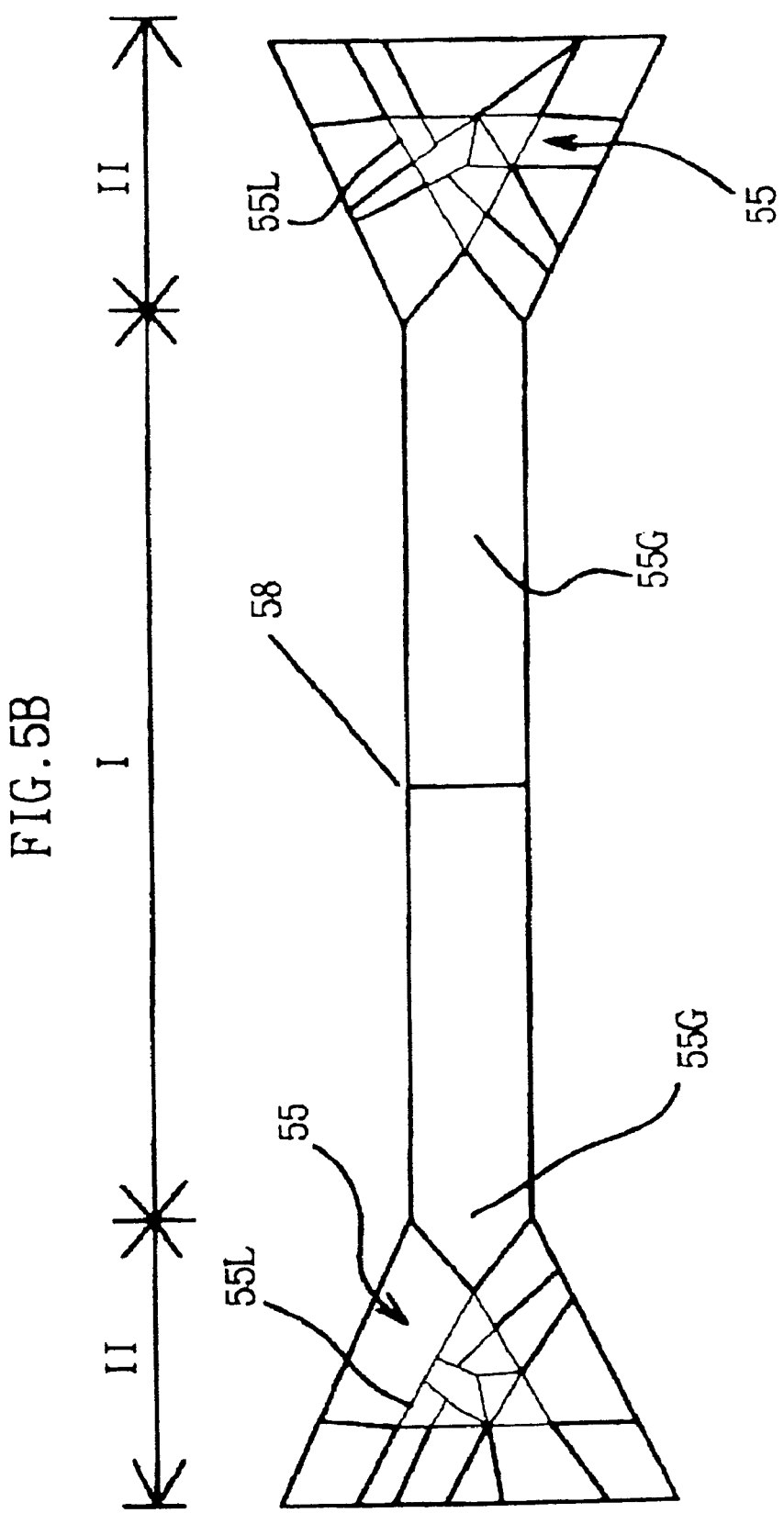

FIG. 5A and FIG. 5B are plan views illustrating crystallization of a silicon film according to a third embodiment of the present invention.

Referring to FIG. 5A, an amorphous silicon film pattern 51 comprises a first region I and a pair of second regions II. The first region I has a first dimension 'd1' from a side of region I to an imaginery axis bisecting region I. Each of the second regions II have a second dimension 'd2' from a central part thereof to an edge, which is longer than 'd1'. Each region II has a triangular shape with a vertex directed to the first region I. The second regions II are connected to both ends of the first region I.

As described in the first embodiment of the present invention, a buffer layer under the amorphous silicon film pattern 51 is overetched, thereby forming a space contact region 51-1 and triangular shaped buffer contact regions 51-2 in the amorphous silicon film pattern 51.

Referring to FIG. 5B, the result of the laser crystallization is the same as in the first embodiment of the present invention but differs in that each silicon grain 55G has a shape growing from the vertex of polysilicon silicon film 55 formed in the buffer contact region 51-2 of the triangular shape. As each of the silicon grains 55G grows perpendicularly from an interface 55L of a melt-down region, grains at the edges of the triangular shape of the polycrystalline silicon region 55 grow freely without the interferences of other silicon grains growing alongside.

Otherwise, the first region I becomes a monocrystalline silicon region consisting of a single silicon grain without a grain boundary 58, if crystallization is achieved by introducing sequential lateral crystallization as explained in the second embodiment of the present invention.

Figure 6A:
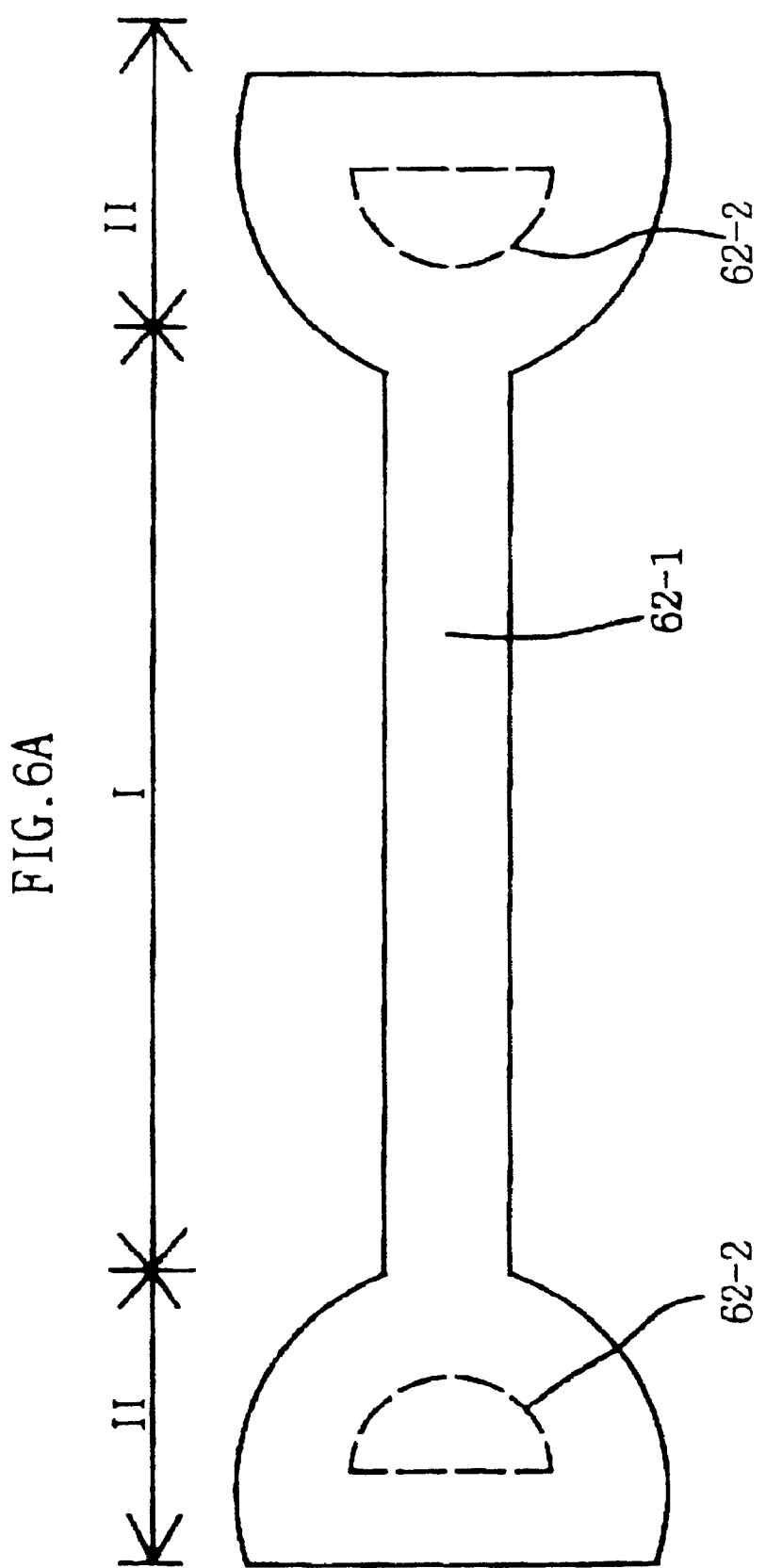
FIG. 6A and FIG. 6B are plan views illustrating crystallization of a silicon film according to a fourth embodiment of the present invention.
Figure 6B:
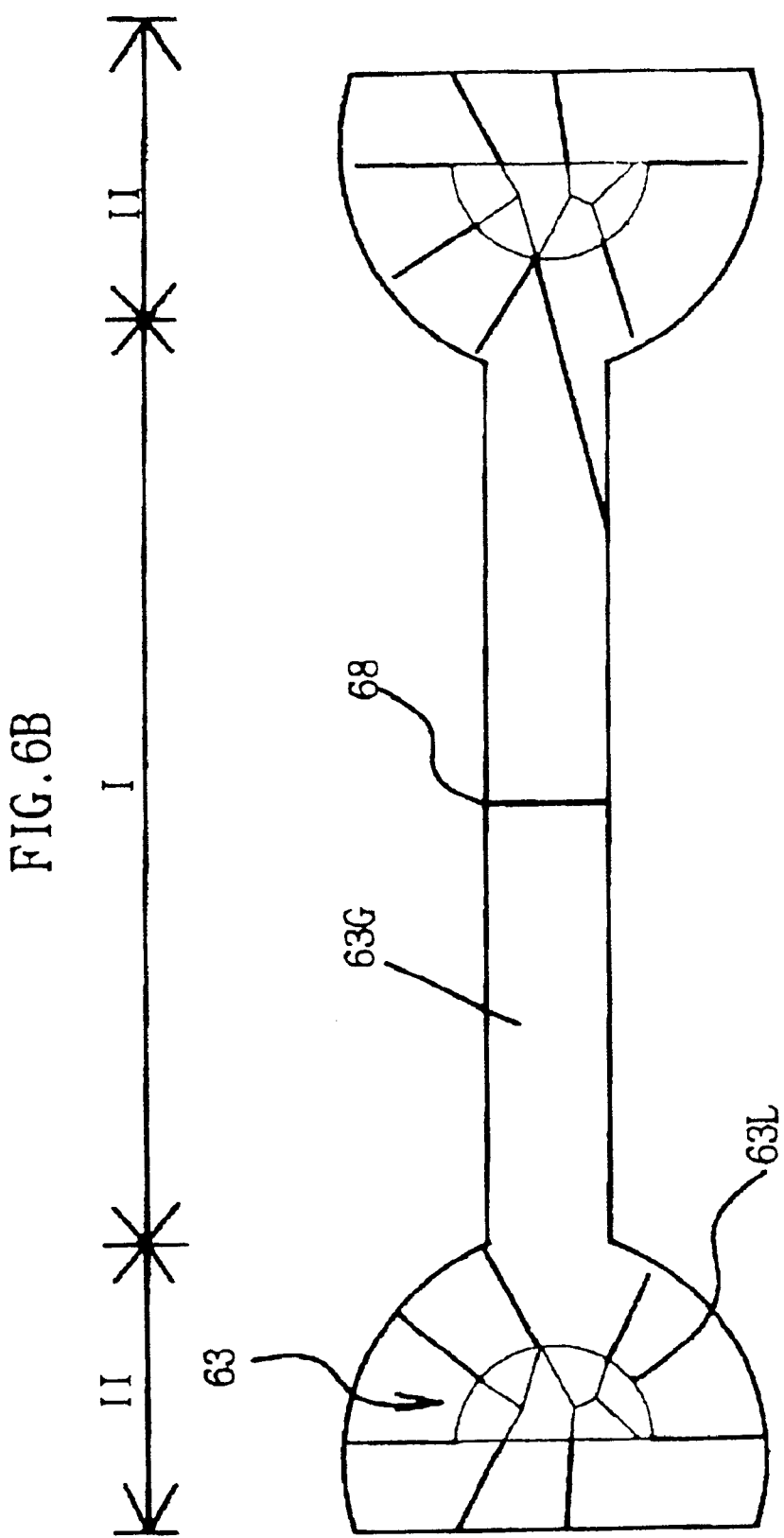

FIG. 6A and FIG. 6B are plan views illustrating crystallization of a silicon film according to a fourth embodiment of the present invention.

Referring to FIG. 6A, the amorphous silicon film pattern is similar to that of the third embodiment of the present invention but differs only in that a pair of second regions II contacting the first region I are patterned to be gently or arcuately curved (as opposed to the third embodiment). Numeral 62-1 denotes a space contact region.

Referring to FIG. 6B, laser crystallization of the third embodiment of the present invention is applied to the fourth embodiment of the present invention. In this case, since an interface directed to the first region I from a polycrystalline silicon region 63 formed in the buffer contact region is smoothly-curved, thermal dissipation therefrom occurs uniformly. Therefore, each silicon grain 63G has fewer defects because less thermal stress is applied thereon.

Otherwise, the first region I becomes a monocrystalline silicon region consisting of a single silicon grain without the grain boundary 68 if crystallization is achieved by introducing sequential lateral crystallization, as discussed above.

Figure 7A:
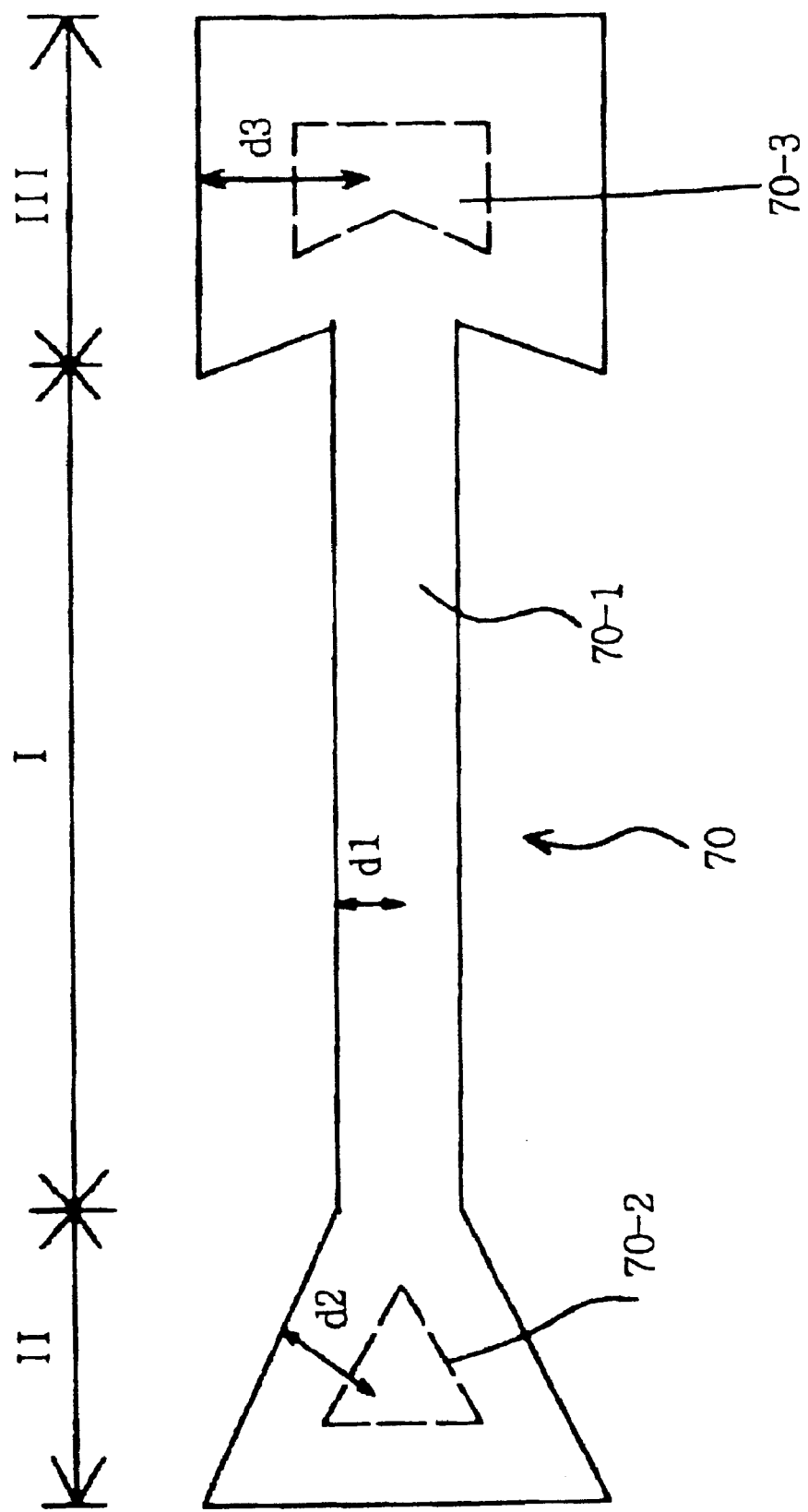
FIG. 7A and FIG. 7B are plan views illustrating crystallization of a silicon film according to a fifth embodiment of the present invention.
Figure 7B:
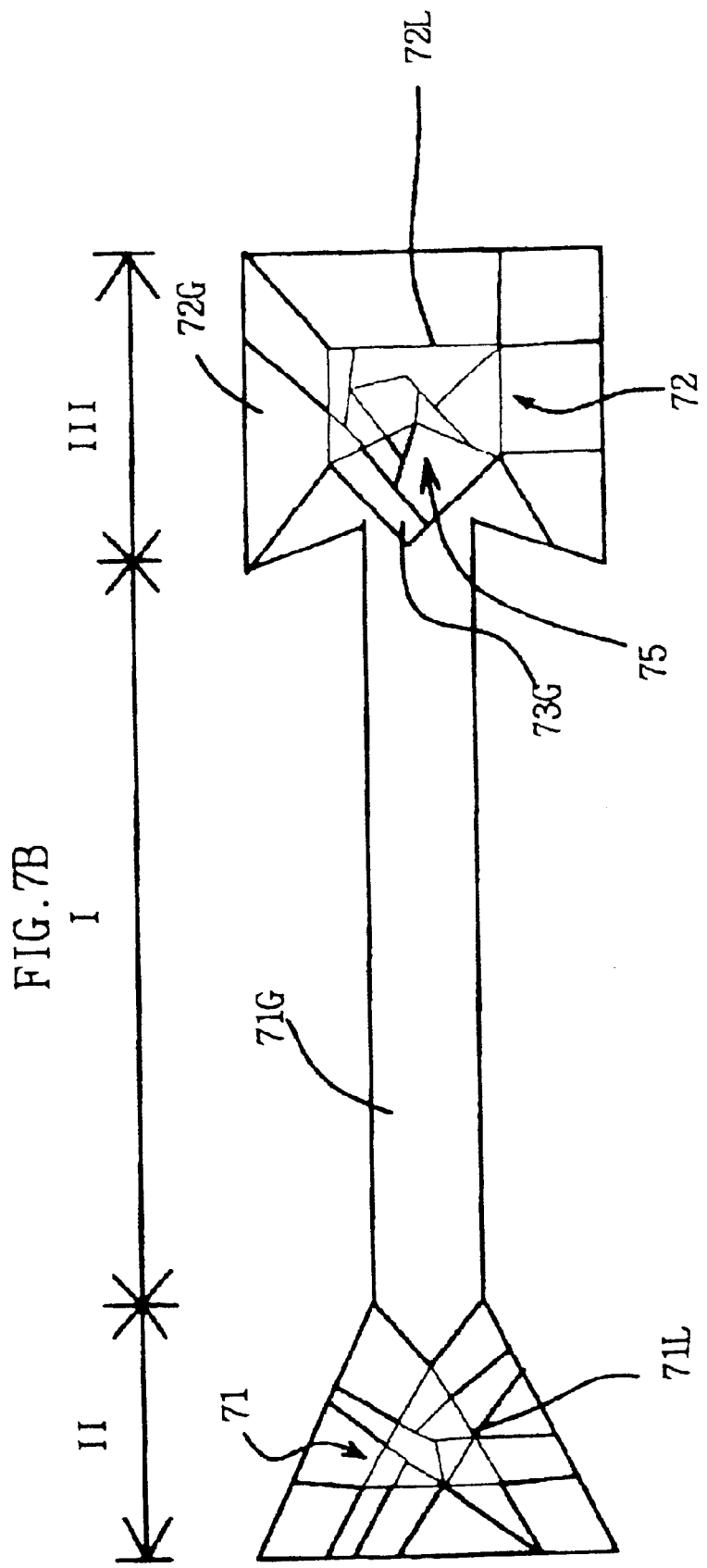

FIG. 7A and FIG. 7B are plan views illustrating crystallization of a silicon film according to a fifth embodiment of the present invention, wherein a monocrystalline silicon grain is formed by a single laser beam irradiation by manipulating a growing direction of a silicon grain.

Referring to FIG. 7A, an amorphous silicon film pattern 70 comprises a first region I of which distance from a central axis is 'd1', a triangular second region II having a vertex connected to one end of the first region I, and a third region III having a concave part connected to the other end of the first region I, wherein a dimension of the second region II to a central part is 'd2' (which is longer than 'd1') and a dimension from an edge of the third region III to a central part is 'd3' (which is longer than 'd1').

A buffer contact region 70-2 of the second region I and the other buffer contact region 70-3 facing each other are centering around the first region I.

Reference numeral 70-1 denotes a space contact region.

Referring to FIG. 7B, as a result of laser crystallization, thermal dissipation takes place rapidly at the buffer contact regions 70-2 and 70-3 of the second and third regions, thereby forming a first polycrystalline silicon region 71 and a second polycrystalline silicon region 72, respectively.

Then, a silicon grain 71G grows from the first polycrystalline silicon region 71 towards the first region while another silicon grain 73G grows from the second polycrystalline silicon region 72.

In this case, since a silicon grain 73G grows from the concave part 75 towards the center due to the shape of the buffer contact region 70-3, silicon grains terminate their growth at a point.

Accordingly, the silicon grain 71G growing from the first polycrystalline silicon region 71 keeps growing in the first region I continuously, thereby forming a single large silicon grain.

Figure 8A:
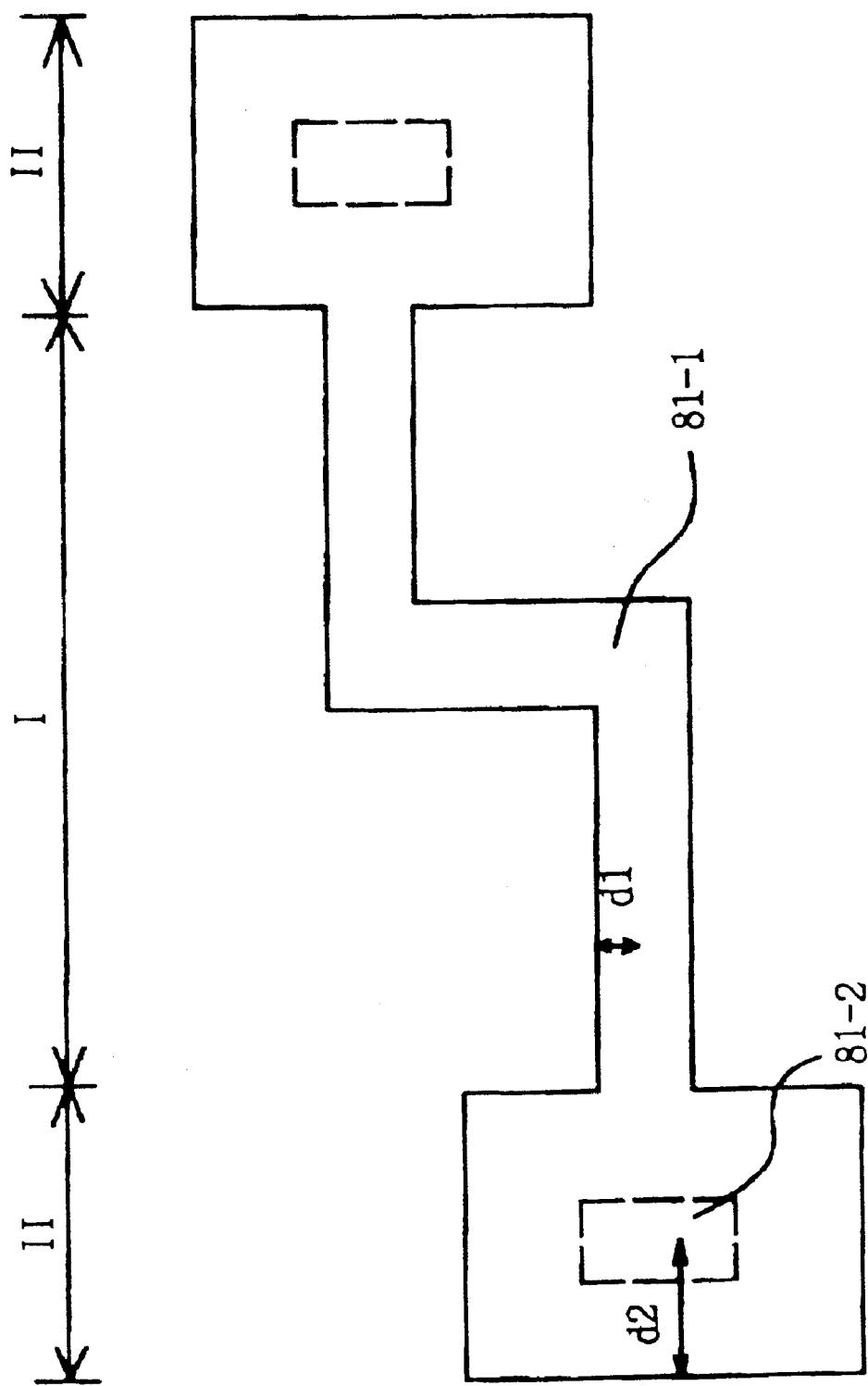
FIG. 8A and FIG. 8B are plan views illustrating crystallization of a silicon film according to a sixth embodiment of the present invention.
Figure 8B:
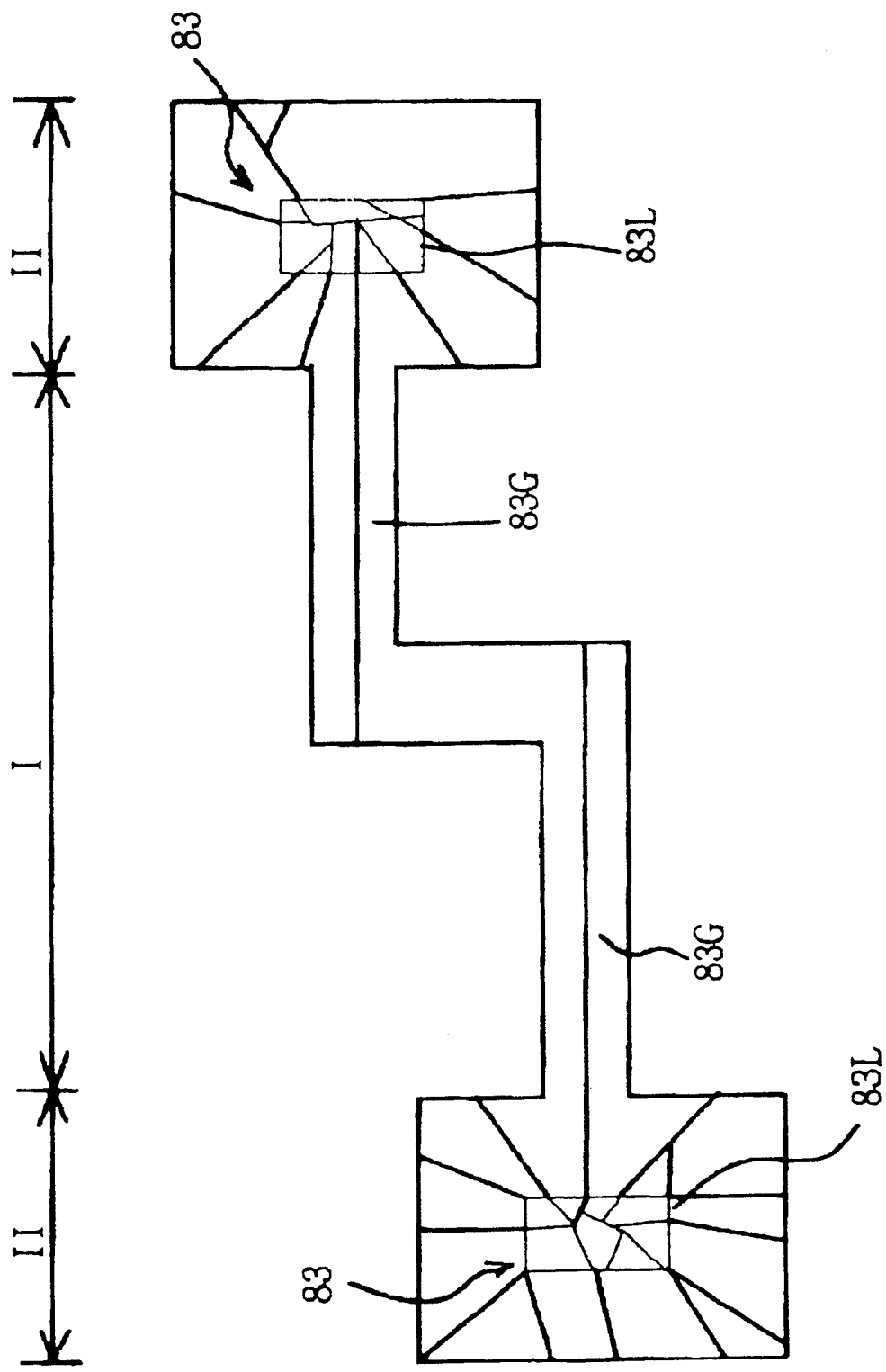

FIG. 8A and FIG. 8B are plan views illustrating crystallization of a silicon film according to a sixth embodiment of the present invention, wherein a pattern of amorphous silicon is prepared to control the direction of grain growth.

Referring to FIG. 8A, a first region I generally extends in a first direction and bends at a predetermined part to extend in a second direction. A distance from a central axis to an edge is 'd1' in the first region I.

Second regions II have a shortest distance from an edge to a central part 'd2' which is longer than 'd1', are connected to both ends of the first region I, and have rectangular shapes.

A numeral 81-1 denotes a space contact region, and other numerals 81-2 and 81-3 are buffer contact regions.

Referring to FIG. 8B, laser crystallization generally results in the same result of the first embodiment of the present invention but is characterized in that silicon grains grow in the first direction and continue to grow into the second direction.

In the buffer contact region, a polycrystalline silicon region 83 is formed. In the space contact region, silicon grains 83G grow perpendicularly to an interface 83L, which acts as seeds for the silicon grains of the polycrystalline silicon region 83. The silicon grains 83G having grown from both polycrystalline regions 83 collide with each other so as to stop their growth.

When the growing direction of one silicon grain 83G is similar to that of the another silicon grain, no grain boundary occurs because of the almost same growing directions, even though the silicon grains 83G collide with each other.

In addition, the first region I becomes a monocrystalline silicon region having no grain boundary if the crystallization is achieved by sequential lateral crystallization.

Figure 9A:
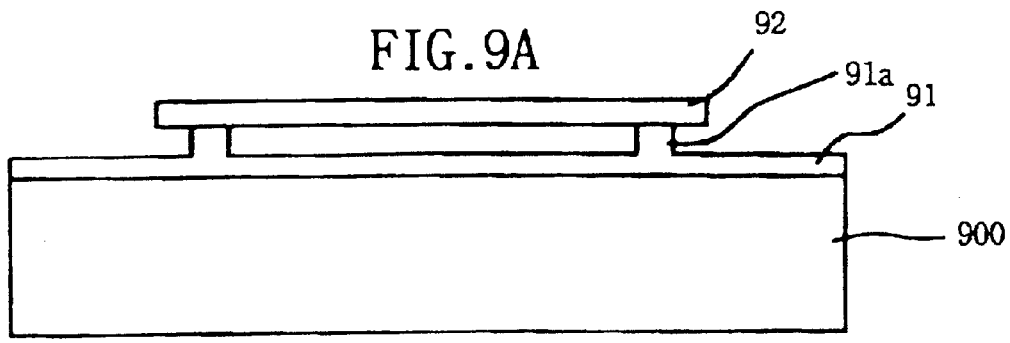
FIG. 9A to FIG. 9C are cross-sectional views illustrating fabrication a thin film transistor according to the present invention.
Figure 9B:
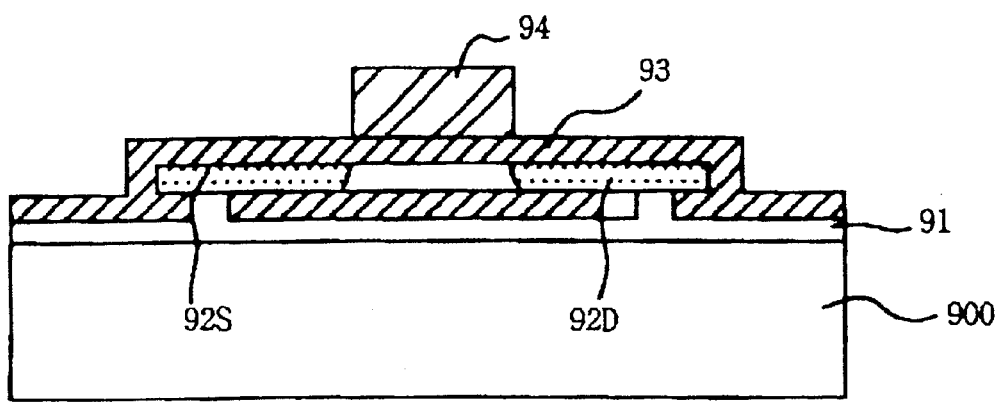
Figure 9C:
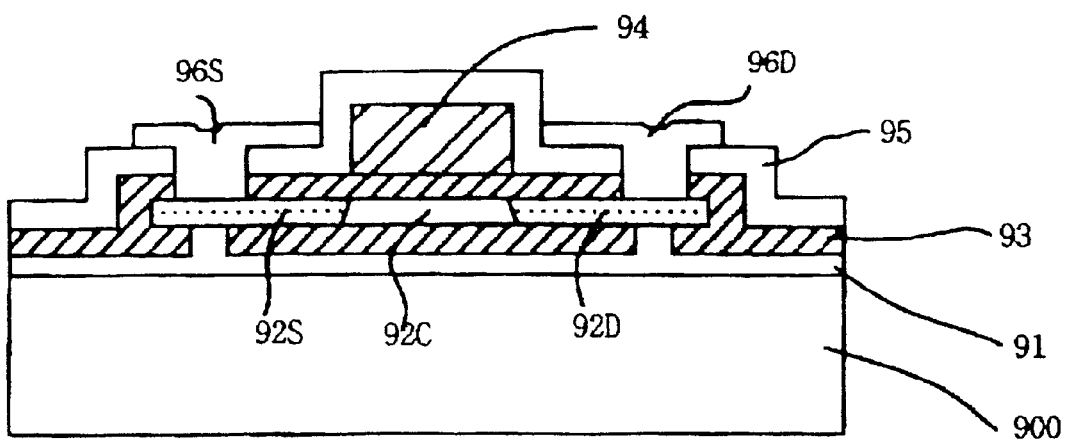

FIG. 9A to FIG. 9C are cross-sectional views illustrating fabrication of a thin film transistor according to the present invention.

Referring to FIG. 9A, as explained in the first to sixth embodiments of the present invention, a buffer layer 91 is formed on a substrate 900.

An amorphous silicon film pattern including a first and second regions connected to both ends of the first region, respectively, is formed on the buffer layer 91.

The buffer layer 91 is etched using the amorphous silicon film pattern as a mask, thereby forming a buffer bridge 91a which defines a buffer contact region where the buffer bridge 91a contacts the amorphous silicon film pattern and a space contact region where the amorphous silicon film pattern does not contact the buffer bridge 91a.

Then, the amorphous silicon film is crystallized.

Numeral '92' denotes a crystallized silicon film.

Referring to FIG. 9B, a gate insulating layer 93 covering an entire exposed surface of the substrate is formed.

A gate electrode 94 is formed on the gate insulating layer 93. In this case, the space under the crystallized silicon film 92 does not need to be filled with the gate insulating layer 93.

The gate insulating layer 93 is formed by depositing a known insulating material such as an organic or an inorganic insulator layer, and the gate electrode 94 is formed of a known metal.

A source region 92S and a drain region 92D. are formed in the silicon film pattern 92 by implanting impurities.

When a TFT is fabricated using the method of crystallizing a silicon film according to the present invention, a channel region 92C between the source and drain regions 92S and 92D has, at most, a silicon grain boundary. Therefore, the channel region 92C almost has characteristics of a monocrystalline silicon.

Referring to FIG. 9C, a passivation layer 95 is formed to cover an exposed surface of the substrate including the gate electrode 94.

Contact holes are formed to expose the source and drain regions 92S and 92D by etching the passivation layer 95 and the gate insulating layer 93 selectively by, for example, photolithography.

Then, a source electrode 96S and a drain electrode 96D are formed by depositing a conductive layer such as a transparent conductive layer and metal layer and by patterning the conductive layer by, for example, photolithography.

As mentioned in the above description, the present invention enables fabrication of a monocrystalline silicon TFT on an insulating substrate.

Accordingly, the present invention enables formation of a silicon film having monocrystalline silicon characteristics. The present invention offers greatly enhanced silicon grain size by improving a silicon film pattern by lengthening the liquid phase during crystallization of liquid silicon.

Moreover, when a thin film transistor is fabricated using the method of crystallizing a silicon film according to the present invention, step coverage of a gate insulating layer formed on an active layer is improved. TFT characteristics are also improved since carrier mobility is improved by the present invention.

It will be apparent to those skilled in the art that various modifications and variations can be made in a method of crystallizing a silicon film and a thin film transistor and a fabricating method thereof using the same of the present invention without departing from the spirit or scope of the inventions. Thus, it is intended that the present invention cover the modifications and variations of this invention provided they come within the scope of the appended claims and equivalents.

What is claimed is:

1. A method of crystallizing an amorphous silicon film, comprising:

forming an amorphous silicon film pattern supported on a buffer layer bridge, the buffer layer bridge being formed to support at least one portion of the amorphous silicon film pattern so as to define a free space under remaining portions of the amorphous silicon film pattern, the buffer layer bridge being formed from a material having a higher thermal conductivity than an ambient atmosphere;

melting at least a part of the amorphous silicon film pattern by applying energy to the amorphous silicon film pattern at least once; and allowing the melted amorphous silicon film pattern to cool so as to form a crystalline silicon film pattern.

2. The method according to claim 1, wherein the amorphous silicon film pattern includes an elongate first region and second regions at respective ends of the first region.

3. The method according to claim 2, wherein the buffer layer bridge supports the amorphous silicon film pattern at a central part of at least one of the second regions.

4. The method according to claim 3, wherein the buffer layer region supports the amorphous silicon film pattern at central parts of both second regions.

5. The method according to claim 2, wherein the second regions are both rectangular.

6. The method according to claim 2, wherein the second regions are triangular.

7. The method according to claim 6, wherein a vertex a respective second region is contiguous with the first region.

8. The method according to claim 2, wherein the second regions have an arcuate side.

9. The method according to claim 8, wherein the arcuate side of a respective second region is contiguous with the first region.

10. The met hod according to claim 2, wherein one second region is generally rectangular but includes an concavely notched side.

11. The method according to claim 10, wherein the concavely notched si de is contiguous with the first region.

12. The method according to claim 2, wherein the first region has at least one direction of extension.

13. The method according to claim 12, wherein the first region has two directions of extension.

14. The method according to claim 1, wherein applying energy comprises applying laser energy at least once.

15. The method according to claim 1, wherein the buffer layer bridge is made from an oxide.

16. The method according to claim 1, wherein allowing the melted amorphous silicon film pattern to cool includes cooling the at least one portion of melted amorphous silicon film pattern supported by the buffer layer bridge more quickly than a remainder of the melted amorphous silicon film pattern because of the thermal conductivity of the buffer layer bridge so as to form a polycrystalline silicon region at the one location supported by the buffer layer bridge.

17. The method according to claim 1, wherein forming an amorphous silicon film pattern supported on a buffer layer bridge comprises:

forming a buffer layer on a substrate;

forming an amorphous silicon layer on the buffer layer;

patterning the amorphous silicon layer to form an amorphous silicon layer pattern; and partially etching the buffer layer from under the amorphous silicon layer pattern to leave a buffer layer bridge supporting at least one portion of the amorphous silicon layer pattern and defining a free space under remaining portions of the amorphous silicon layer pattern.

18. The method according to claim 1, wherein melting at least a part of the amorphous silicon film pattern comprises melting successive parts of the amorphous silicon film pattern.

19. The method according to claim 1, wherein melting at least a part of the amorphous silicon film pattern comprises melting the entire amorphous silicon film pattern.

20. A method of forming a thin film transistor, comprising:

forming an amorphous silicon film pattern supported on a buffer layer bridge, the buffer layer bridge being formed to support at least one portion of the amorphous silicon film pattern so as to define a free space under remaining portions of the amorphous silicon film pattern, the buffer layer bridge being formed from a material having a higher thermal conductivity than an ambient atmosphere;

melting at least a part of the amorphous silicon film pattern by applying energy to the amorphous silicon film pattern at least once;

allowing the melted amorphous silicon film pattern to cool so as to form a crystalline silicon film pattern;

forming source and drain regions in the crystalline silicon film pattern;

forming a gate insulating layer over the crystalline silicon film pattern; and forming a gate electrode on the gate insulating layer.

21. The method according to claim 20, further comprising:
- forming a passivation layer over the gate electrode and the gate insulating layer;
- forming contact holes through the passivation and gate insulating layers to expose the source and drain regions, respectively; and
- forming source and drain electrodes contacting the exposed source and drain regions, respectively.

22. The method according to claim 20, wherein forming source and drain regions comprises using the gate electrode as a mask during impurity doping.

* * * * *